United States Patent
Grüning et al.

[11] Patent Number: 6,072,200
[45] Date of Patent: Jun. 6, 2000

[54] GATE UNIT FOR A HARD-DRIVEN GTO

[75] Inventors: Horst Grüning, Wettingen; Enrico Piccioni, Baden-Rütihof, both of Switzerland

[73] Assignee: Asea Brown Boveri AG, Baden, Switzerland

[21] Appl. No.: 09/034,993

[22] Filed: Mar. 5, 1998

[30] Foreign Application Priority Data

Mar. 5, 1997 [DE] Germany ............... 197 08 873

[51] Int. Cl.[7] .................. H01L 29/744; H01L 29/41; H01L 23/34
[52] U.S. Cl. ................ 257/177; 257/107; 257/723; 257/731; 257/732; 361/717; 361/719
[58] Field of Search ..................... 257/731, 732, 257/107, 177, 723; 361/717, 719

[56] References Cited

U.S. PATENT DOCUMENTS

| | | |
|---|---|---|
| 3,708,732 | 1/1973 | Faust . |
| 4,477,970 | 10/1984 | Alexander et al. . |
| 5,512,790 | 4/1996 | Lachenmaier ............ 307/112 |

FOREIGN PATENT DOCUMENTS

| | | |
|---|---|---|
| 0 328 778 | 8/1989 | European Pat. Off. . |
| 0 328 778 | 3/1992 | European Pat. Off. . |
| 0 489 945 A1 | 6/1992 | European Pat. Off. . |
| 0 588 026 | 3/1994 | European Pat. Off. . |
| 0 588 026 A2 | 3/1994 | European Pat. Off. . |
| 0 785 627 | 7/1997 | European Pat. Off. . |
| 40 09 289 A1 | 9/1991 | Germany . |
| 43 27 766 C2 | 4/1997 | Germany . |
| 61-112568 | 5/1986 | Japan . |
| WO 93/09600 | 5/1993 | WIPO . |

OTHER PUBLICATIONS

Article entitled: "Serienschaltung Von GTO–Thyristoren Fur Frequenzumrichter Hoher Leistung"; ABB Technik May 1996; pp. 14–20.

Serienschaltung von GTO–Thyristoren fur Frequenzumrichter hoher Leistung, ABB Technik, Nr. 5, 1996, Seiten 14–20.

*Primary Examiner*—Jerome Jackson, Jr.
*Attorney, Agent, or Firm*—Oblon, Spivak, McClelland, Maier & Neustadt, P.C.

[57] ABSTRACT

In a gate unit (47) for a hard-driven GTO (10), at least some of the electronic components (37, . . , 42) needed for driving are arranged on a printed circuit board (34). The printed circuit board (34) encloses the GTO (10), in order to achieve low-inductance contact, in a plane lying between the anode side and the cathode side of the GTO (10) parallel to the semiconductor substrate (17) of the GTO (10) and is directly connected to the cathode contact (14) and the gate connection (22) of the GTO (10). A compact structure with, at the same time, improved mechanical stability is achieved in such a gate unit in that the components (37, . . , 42) are arranged on the printed circuit board (34) around the GTO (10), in the immediate vicinity of the GTO (10).

19 Claims, 3 Drawing Sheets

GATE UNIT FOR A HARD-DRIVEN GTO

BACKGROUND OF THE INVENTION

1. Field of the Invention

The present invention relates to the field of power electronics. It concerns a gate unit for a hard-driven GTO, in which gate unit at least some of the electronic components needed for driving are arranged on a printed circuit board and surrounded by a shield, said printed circuit board enclosing the GTO, in order to achieve low-inductance contact, in a plane lying between the anode side and the cathode side of the GTO, parallel to the semiconductor substrate of the GTO and being directly connected to the cathode contact and the gate connection of the GTO.

2. Discussion of Background

Such a gate unit is disclosed, for example, in the publication ABB Technik, Issue 5/96, pages 14–20 (see, in particular, FIG. 5 therein).

In recent years, so-called hard driving when using high power semiconductor components in the form of GTOs (Gate Turn Off Thyristors) has attracted greatly increasing interest. Particularly in the case of series circuits comprising a number of GTOs, as are necessary, for example, in high power converters for mains connections or the like, hard driving ensures that the individual GTOs in the series circuit can be turned off very precisely at the same time, and hence no harmful overvoltages occur across individual GTOs. In hard driving mode, the GTO is driven by a gate current $I_G$ with a very high gradient (e.g. 3 kA/$\mu$s instead of 30 A/$\mu$s as in conventional driving).

In order to be able to produce such gradients, the gate circuit of the GTO must be designed to have an extremely low inductance (<5 nH), which demands particular design measures and precautions not only for the gate unit (GU) used for driving, but also for the GTO itself. Detailed information on hard driving can be found in the publication mentioned in the introduction, in European Patent Application EP-A1-0 489 945, in WO-93/09600 or in the article by H. Grüning et al. "High Power Hard-Driven GTO Module for 4.5 kV/3 kA Snubberless Operation", PCIM '96, Nuremberg, Germany, May 21–23, 1996, the content of which is expressly intended to be part of the disclosure of this application.

FIG. 1 shows a basic circuit diagram as an example of a known GU for hard driving, which essentially comprises:

- a turn off channel having a high current switch (S3), a capacitor bank (C2) formed from a plurality of electrolytic capacitors and having a reverse-connected parallel diode (D2), a voltage source (13) and a drive (not shown); a second switch (S4) keeps the GTO 10 turned off; a further series circuit comprising a resistor (R2) and a diode (D3) is additionally provided;
- a turn on channel having a medium current switch (S2), a voltage source (12) and a pulsed current source (a capacitor Ci having a reverse-connected parallel diode D1); a second switch (S1) with a resistor (R1) in series keeps the GTO 10 turned on;
- a logic unit (not shown in FIG. 1) having a fiber-optic input, amplifier and delay stages and a voltage converter; and
- if appropriate, a status signal device.

The design of the known GUs can be seen in the photograph in FIG. 5 of the publication mentioned in the introduction and in the schematic illustration in FIG. 3 of the present application. The complete logic unit, the power stages of the turn on channel and the stages of the turn off channel (components 30 shown by dashed lines in FIG. 3) in the gate unit 28 are located very closely together on a printed circuit board (board) 29, arranged at the side of and at some distance from the actual GTO 25. The gate unit 28 with the components 30 is surrounded by a separate housing 32 and accordingly shielded from the outside. The gate unit 28 is connected to the GTO 25 by means of a printed circuit board part enclosing the GTO 25 arranged next to it. The anode contact 27 of the GTO 25 is freely accessible from above. The (annular) gate connection of the GTO 25 is connected directly to the printed circuit board 29. A connection region 31 is provided for feeding control signals via optical waveguides.

The GTO 25 itself is a component of coaxial design. A (known) internal structure of such a GTO is shown by way of example in FIG. 2 in partially shaded section. The core of the GTO 10 is a disk-shaped semiconductor substrate 17 on which a multiplicity of individual elements are arranged next to one another in a known manner. The edges of the semiconductor substrate 17 are provided with an edge passivation 20. The semiconductor substrate is located between a disk-shaped anode contact 14 and a disk-shaped cathode contact 19 which are pressed against the (metallized) semiconductor substrate 17 under pressure when the GTO 10 is assembled, in order to produce electrical and thermal contact with the anode A and the cathode K. To compensate for different coefficients of expansion, Mo disks 16 and 18 are usually also provided between the contacts 14, 19 and the semiconductor substrate 17. To make contact with the gate G, an annular, low inductance gate contact 21 is provided which is connected radially to the outside through the ceramic insulating housing 23 via an annular gate connection 22. The insulating housing 23 is hermetically sealed from the outside at the top and the bottom by means of attached flanges 15b, 24b and covers 15a, 24a welded to the flanges.

The known gate unit 28 with the GTO 25 as shown in FIG. 3 produces the low inductance connection desired between the drive and the power semiconductor. The parasitic inductance in the gate circuit (11 in FIG. 1) is less than 5 nH. By directly connecting the GTO 25 and the gate unit 28 by means of the rigid printed circuit board 29, a module is generally produced which can be produced and tested as a unit and inserted into the stack of the series circuit. The drive electronics are well shielded against EMIR by the housing 32, closed on all sides.

These important advantages over the known gate unit are in contrast to a number of disadvantages, however:

- The electronics of the gate unit are clustered into a structure of considerable size and mass; the electrolytic capacitors used as the current source for the gate current are particular contributors to this; a GTO with the performance specification 4 kA/4.5 kV requires, for example, 40 electrolytic capacitors of 1500 $\mu$F/35 V each, and a (smaller) reverse-conducting 600 A/6 kV GTO requires around 10 electrolytic capacitors of 1500 $\mu$F/35 V each; this structure is located on one side of the GTO and the cooler; it must be kept at an additional distance from the cooler so that it does not come too close to the cooler on the anode side (insulation distance). This makes it mechanically extremely difficult to fasten and not very robust in the face of vibratory movements and oscillations.
- Fastening is costly.
- The gate unit increases the structural size of the converter considerably, because it spans a large space which can be filled only with difficulty.

SUMMARY OF THE INVENTION

Accordingly, one object of the invention is to provide a novel gate unit which avoids these disadvantages and is compact in structure, can be constructed easily and inexpensively, and is distinguished by high mechanical stability, whilst at the same time retaining a low inductance connection and good shielding.

The object is achieved with a gate unit of the type mentioned in the introduction in that the components are arranged on the printed circuit board in the immediate vicinity of the GTO. Arranging the components, or drive electronics, directly close to the GTO avoids masses that can oscillate projecting a long way at the sides, and hence the mechanical stability is greatly increased. At the same time, the gate unit conserves space as a result of the compact structure around the GTO. The module comprising the GTO and the gate unit also becomes more manageable and can be fitted and removed more easily.

A first preferred embodiment of the novel gate unit is distinguished in that the GTO is adjacent to a heat sink on the cathode side, in that the printed circuit board protrudes laterally beyond the cooler that is on the cathode side, in that the electronic components arranged on the printed circuit board comprise a plurality of capacitors, particularly electrolytic capacitors, which form a current source, inside the gate unit, for a pulsed gate current in the GTO, and in that the capacitors are arranged in the immediate vicinity of the cooler on that part of the printed circuit board which protrudes beyond the cooler. This means that even the relatively large volume, heavy capacitors can be arranged so close to the GTO that a significant gain in mechanical stability results.

A further preferred embodiment of the gate unit claimed in the invention is distinguished in that the components are predominantly arranged on that side of the printed circuit board which faces the cooler or the cathode side of the GTO, the printed circuit board is spaced apart from the cooler that is on the cathode side, and in that some of the components are arranged between the printed circuit board and the cooler. This results in the cooler, that is on the cathode side, being used both for protecting and for shielding smaller components (e.g. SMDs) in particular, whilst conserving materials and space.

On the basis of a further embodiment of the invention, the shield is completed in that the printed circuit board is provided with metallization on that side which faces away from the cathode side of the GTO, and in that the metallization is used as a shield for the gate unit.

On the basis of another embodiment of the invention, the shield is completed in that an electrically conductive casing is provided in order to shield the components, said casing laterally enclosing the GTO and covering the printed circuit board, fitted with the components, on that side which faces away from the cathode side of the GTO.

A further preferred embodiment of the gate unit as claimed in the invention is distinguished in that the printed circuit board protrudes laterally beyond the cooler that is on the cathode side, in that the side wall of the casing also encloses a part of the cooler in such a way that a circumferential interspace remains open between the cooler and the casing or the side wall of the casing, and in that some of the components are arranged in the interspace. This creates, in a simple manner, a protected and shielded area in which the larger components, in particular, of the gate unit, such as the electrolytic capacitors in the turn off channel (C2 in FIG. 1) for example, can be safety accommodated.

A further preferred embodiment which is notable for its particularly high mechanical stability is distinguished in that fastening elements are arranged on the printed circuit board and can be used to fasten the printed circuit board to the cooler lying beneath it, and/or in that additional means are provided for supporting the printed circuit board on the casing.

Further embodiments emerge from the dependent claims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
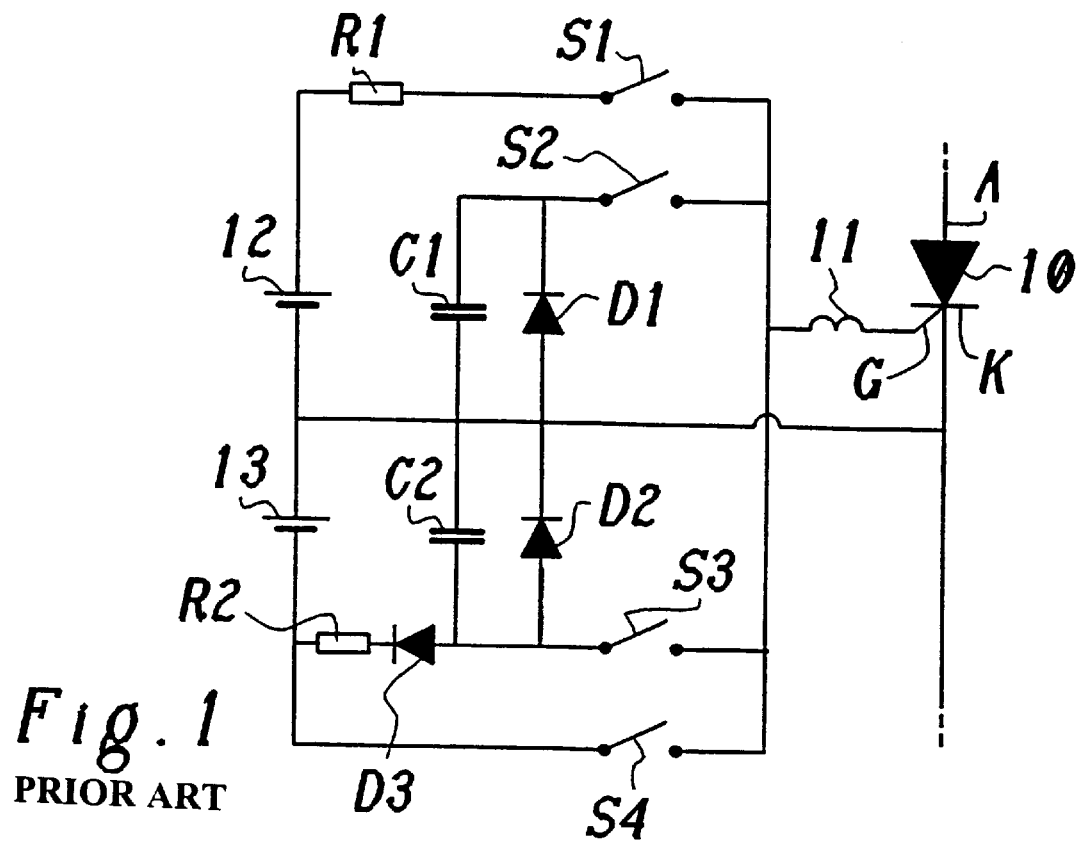
FIG. 1 shows an exemplary basic circuit diagram of a hard drive for a GTO as described in the prior art.
Figure 2:
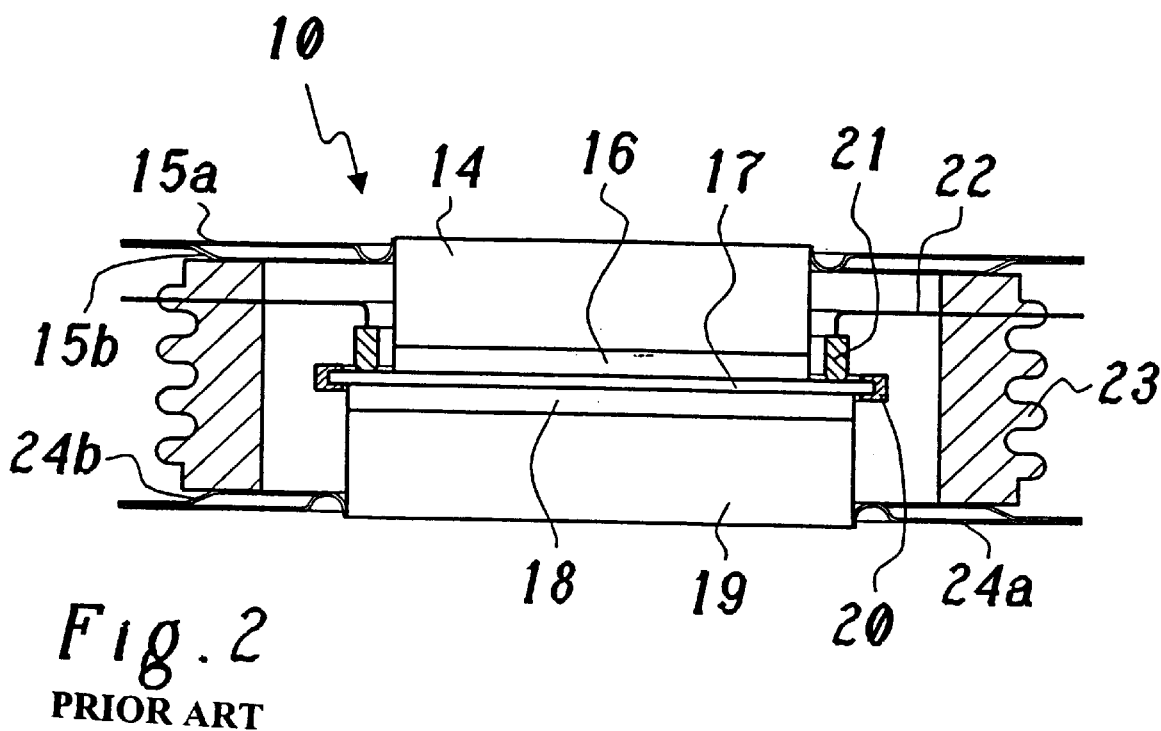
FIG. 2 shows a cross section of the internal structure of a known coaxial GTO with an annular, low inductance gate connection.
Figure 3:
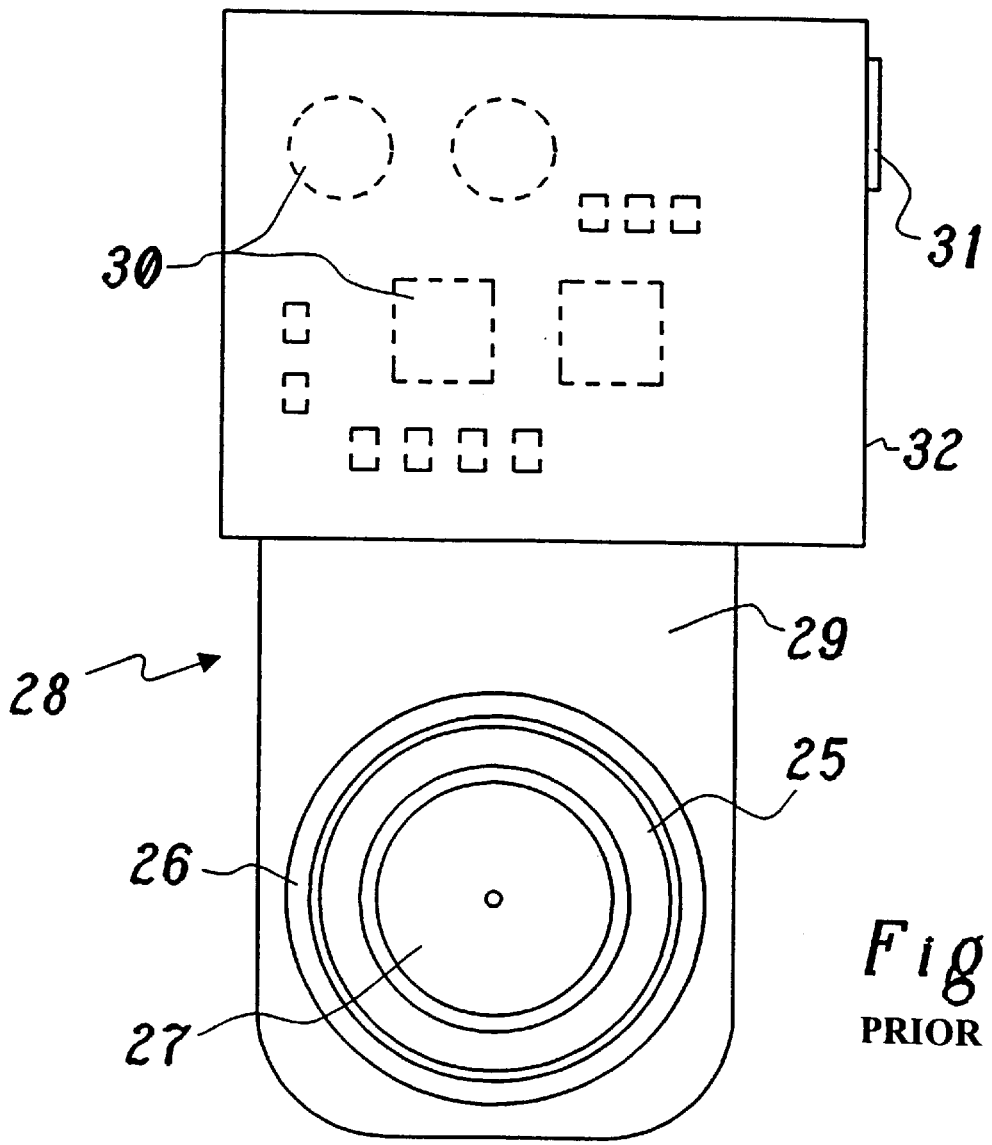
FIG. 3 shows a plan view of a module comprising a coaxial GTO and a directly connected gate unit for the hard drive described in the prior art.
Figure 4:
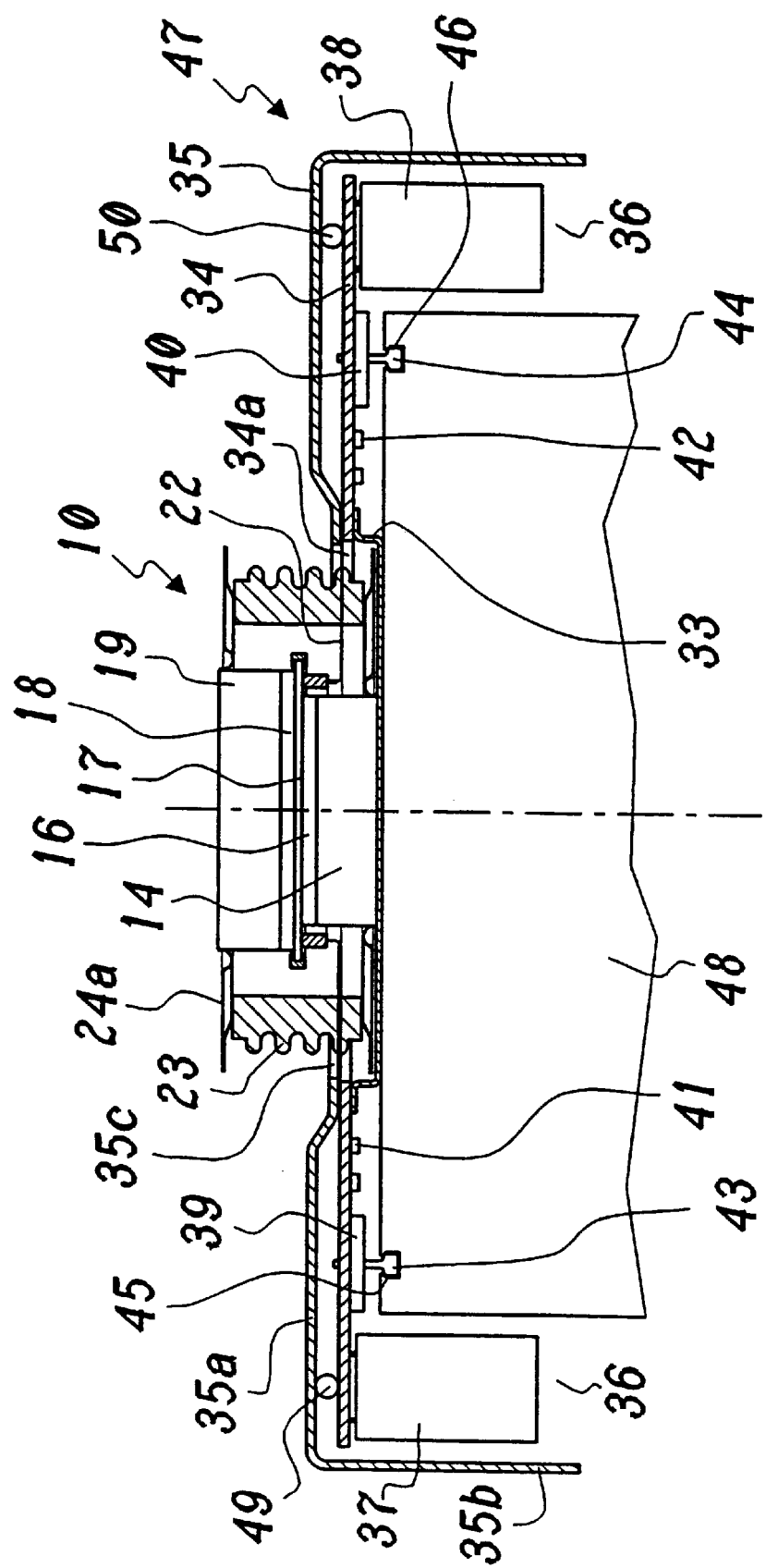
FIG. 4 shows a sectional view of the GTO shown in FIG. 2, having a gate unit based on a preferred embodiment of the present invention.

Referring now to the drawings, wherein like reference numerals designate identical or corresponding parts throughout the several views, FIG. 4 illustrates a sectional view of the known GTO shown in FIG. 2, having a gate unit 47 based on a preferred embodiment of the present invention. The same reference numerals have been used for the GTO 10 in FIG. 4 as in FIG. 2. The only difference is that GTO 10 is arranged rotated through 180° with respect to the illustration in FIG. 2, i.e. with the cathode contact 14 pointing downward and the anode contact pointing upward.

The coaxial (axisymmetrically designed) GTO 10 is surrounded toroidally by a (generally multilayer) printed circuit board 34 arranged parallel to the plane of the semiconductor substrate 17 at the level of the gate connection 22. The printed circuit board 34 is fitted upside down, i.e. the interconnected components 37, . . . , 42 fitted to it are arranged on the underside. The components 37, . . . , 42 are therefore predominantly oriented towards the cooler 48, which is on the cathode side, is in thermal contact with the cathode contact 14 of the GTO 10 and may be designed as a water cooler or else as an air cooler. In addition to the cooling function, the cooler 48 thus has, at the same time, an electrical shielding function for the components 37, . . . , 42 on its side of the printed circuit board 34, by virtue of its metal parts. On the other side of the printed circuit board 34, existing metallization provided on the printed circuit board 34 can in principle be used as the shield. This presents itself when (with a relatively small GTO 10) the printed circuit board 34 itself is sufficiently robust to be able to support the connected GTO 10 safely during handling.

With a large and heavy (more than 1 kg) GTO 10, however, a casing 35 made of sheet metal is provided on that side of the printed circuit board 34 which faces away from the cooler 48 for further shielding, for producing further mechanical stability and for improved handling of the unit, said casing preferably having an essentially even base 35a and a side wall 35b angled from the base 35a. The casing 35 is arranged between the printed circuit board 34 and the anode side of the GTO 10 with its base 35a parallel to the printed circuit board 34. The side wall 35b laterally surrounds the printed circuit board 34. The casing 35 has a central hole 35c in the base, through which the GTO 10 extends. It is fastened to the printed circuit board 34 by the base 35a, in particular by means of the edge of the hole 35c which is bent slightly downward, and thus makes a significant contribution to the mechanical stability of the arrangement. In order to improve the support, additional supporting means, particularly in the form of silicone beads 49, 50 or the like, may be provided further toward the outside between the printed circuit board 34 and the casing 35.

The gate unit 47 comprises electronic components of different sizes, such as surface mounted resistors, MOSFET switches or electrolytic capacitors for pulsed current supply, for example. These components are preferably arranged, depending on the size, at different points between the printed circuit board 34 and the cooler 48. For flat components such as the resistors 41, 42 or the MOSFETs 39, 40, it is sufficient for the printed circuit board 34 to be spaced apart from the cooler 48 that is on the cathode side, and for this portion of the components to be arranged directly between the printed circuit board 34 and the cooler 48. In this way, a great deal of space is conserved whilst at the same time providing very good shielding. For tall components such as the electrolytic capacitors 37, 38, the printed circuit board 34 is preferably designed to protrude laterally beyond the cooler 48 that is on the cathode side. The side wall 35b of the casing 35 also encloses a part of the cooler 48 in such a way that an interspace 36 remains open between the cooler 48 and the casing 35 or the side wall 35b of the casing. This portion of the components is then arranged in this interspace 36, in the immediate vicinity of the cooler 48.

If the cooler 48 has a rectangular cross section, the electrolytic capacitors 37, 38 are preferably arranged on at least two (especially opposite) sides of the cooler 48. If the cooler 48 has a circular cross section, the electrolytic capacitors 37, 38 are preferably arranged in a ring around the cooler 48. In both cases, the result is a compact structure with an even distribution of weight.

To increase stability further, it is possible to provide for the printed circuit board 34 to be fastened detachably on the cooler. For this purpose, fastening elements 43, 44, for example in the form of rails or guide bolts, are arranged on the printed circuit board 34 and can be used to fasten the printed circuit board 34 to fastening devices 45, 46, for example in the form of rails, on the cooler 48 lying beneath it. It is equally conceivable, however, for the cooler to have clips fastened to it, into which the printed circuit board 34 is snapped to lock it in place when the stack is assembled.

In addition, the printed circuit board 34 has a hole 34a in its center for accommodating the GTO 10. The hole 34a is preferably closed off with an electrically conductive trough 33 (made of sheet metal) into which the cathode contact 14 of the GTO 10 can be inserted and which electrically connects the cathode contact 14 to the printed circuit board 34 and the gate unit 47. For this purpose, the trough 33 is connected or fastened on the underside of the printed circuit board 34. Finally, the GTO 10 is connected to the topside of the printed circuit board 34, by means of its annular gate connection 22 together with the casing 35.

Within the framework of the invention, the gate unit 47 can be implemented in many different ways than the exemplary embodiment illustrated in FIG. 4. For example, the input amplifiers and the optical coupling elements may also be housed in the interspace 36, in addition to the electrolytic capacitors 37, 38. It is also conceivable for the logic unit required to operate the gate unit to be arranged on a separate SMD board fitted vertically on the printed circuit board 34 acting as the motherboard. Finally, however, the logic units for the various gate units in a converter and the power supply elements can also be arranged at a central location in the converter outside the gate units. As a result, connection of the optical drive connections (optolinks) and latching between the individual gate units are made significantly easier.

Overall, the invention provides a gate unit which is distinguished by the following features and advantages:

the gate unit is small;

it encloses the GTO and forms a unit with the cooler (that is on the cathode side);

the connection for the cathode of the GTO can be produced particularly cheaply;

the shield between the gate unit and the anode can be produced in one step; it performs two functions in operation (support and shielding) and supports the GTO and the gate unit during handling;

the unit comprising the gate unit and the GTO can furthermore be pushed into the stack; and the heavy components can be fixed in a mechanically optimum fashion.

Obviously, numerous modifications and variations of the present invention are possible in light of the above teachings. It is therefore to be understood that within the scope of the appended claims, the invention may be practiced otherwise than as specifically described herein.

LIST OF DESIGNATIONS

10 GTO (Gate Turn Off Thyristor)
11 Stray inductance
12 Voltage source (turn on circuit)
13 Voltage source (turn off circuit)
14 Cathode contact
15a, 24a Cover
15b, 24b Flange
16, 18 Mo disk
17 Semiconductor substrate
19 Anode contact
20 Edge passivation
21 Gate contact (annular)
22 Gate connection
23 Insulating housing (e.g. ceramic)
25 GTO (coaxial)
26 Gate connection
27 Anode contact
28 Gate unit
29 Printed circuit board
30 Component (electronic)
31 Connection region
32 Housing (gate unit)
33 Trough
34 Printed circuit board
34a Hole (printed circuit board)
35 Casing (shield)
35a Base (casing)
35b Side wall (casing)
36c Hole (casing)
36 Interspace (cooler-casing)
37, 38 Electrolytic capacitor
39, 40 MOSFET 41, 42 Component (resistor etc.)
43, 44 Fastening element
45, 46 Fastening device (fastening element)
47 Gate unit
48 Cooler
49, 50 Silicone bead
A Anode (GTO)
C1, C2 Capacitor
D1, . . . , D3 Diode
G Gate (GTO)
K Cathode (GTO)
R1,R2 Resistor
S1, . . . , S4 Switch (e.g. MOSFET)

What is claimed as new and desired to be secured by Letters Patent of the United States is:

1. A gate unit for a hard-driven GTO, in which gate unit at least some of the electronic components needed for driving are arranged on a printed circuit board and surrounded by a shield, said printed circuit board enclosing the GTO, in order to achieve low-inductance contact, in a plane lying between the anode side and the cathode side of the GTO parallel to the semiconductor substrate of the GTO and being directly connected to the cathode contact and the gate connection of the GTO, wherein the components are arranged on the printed circuit board in the immediate vicinity of the GTO, wherein the GTO adjoins a cooler on the cathode side, wherein the printed circuit board protrudes laterally beyond the cooler that is on the cathode side, wherein the electronic components arranged on the printed circuit board comprise a plurality of capacitors, particularly electrolytic capacitors, which form a current source, inside the gate unit, for a pulsed gate current in the GTO, and wherein the capacitors are arranged in the immediate vicinity of the cooler on the part of the printed circuit board which protrudes beyond the cooler.

2. The gate unit as claimed in claim 1, wherein the components are predominantly arranged on that side of the printed circuit board which faces the cooler or the cathode side of the GTO.

3. The gate unit as claimed in claim 1, wherein the cooler has a rectangular cross section, and wherein the capacitors or electrolytic capacitors are arranged on at least two sides of the cooler.

4. The gate unit as claimed in claim 1, wherein the cooler has a circular cross section, and wherein the capacitors or electrolytic capacitors are arranged in a ring around the cooler.

5. The gate unit as claimed in claim 1, wherein the components are predominantly arranged on that side of the printed circuit board which faces a cooler or the cathode side of the GTO.

6. The gate unit as claimed in claim 5, wherein the printed circuit board is spaced apart from the cooler that is on the cathode side, and wherein some of the components are arranged between the printed circuit board and the cooler.

7. The gate unit as claimed in claim 5, wherein the printed circuit board is provided with metallization on that side which faces away from the cathode side of the GTO, and wherein the metallization is used as a shield for the gate unit.

8. The gate unit as claimed in claim 1, wherein an electrically conductive casing is provided in order to shield the components, said casing laterally enclosing the GTO and covering the printed circuit board, fitted with the components, on that side which faces away from the cathode side of the GTO.

9. The gate unit as claimed in claim 8, wherein the casing has an essentially even base and a side wall angled from the base, wherein the casing is arranged between the printed circuit board and the anode side of the GTO with its base parallel to the printed circuit board, and wherein the side wall laterally surrounds the printed circuit board.

10. The gate unit as claimed in claim 9, wherein the casing is fastened to the printed circuit board by its base.

11. The gate unit as claimed in claim 8, wherein the casing is formed from a metal sheet.

12. The gate unit as claimed in claim 9, wherein the printed circuit board protrudes laterally beyond the cooler that is on the cathode side, wherein the side wall of the casing also encloses a part of the cooler in such a way that an interspace remains open between the cooler and the casing or the side wall of the casing, and wherein some of the components are arranged in the interspace.

13. The gate unit as claimed in claim 1, wherein the printed circuit board has a hole in its center for accommodating the GTO, and wherein the hole is closed off with an electrically conductive trough into which the cathode contact of the GTO can be inserted and which electrically connects the cathode contact to the printed circuit board and the gate unit.

14. The gate unit as claimed in claim 13, wherein the trough is connected or fastened on the underside of the printed circuit board, and wherein the GTO is connected to the topside of the printed circuit board by means of its annular gate connection.

15. The gate unit as claimed in claim 1, wherein fastening elements are arranged on the printed circuit board and can be used to fasten the printed circuit board to the cooler lying beneath it.

16. The gate unit as claimed in claim 8, wherein additional means are provided for supporting the printed circuit board on the casing.

17. The gate unit as claimed in claim 3, wherein the components are predominantly arranged on that side of the printed circuit board which faces the cooler or the cathode side of the GTO.

18. The gate unit as claimed in claim 4, wherein the components are predominantly arranged on that side of the printed circuit board which faces the cooler or the cathode side of the GTO.

19. The gate unit as claimed in claim 6, wherein the printed circuit board is provided with metallization on that side which faces away from the cathode side of the GTO, and wherein the metallization is use d as a shield for the gate unit.

* * * * *